United States Patent
Kwon

(10) Patent No.: US 11,251,252 B2
(45) Date of Patent: Feb. 15, 2022

(54) ORGANIC LIGHT EMITTING DISPLAY APPARATUS

(71) Applicant: LG DISPLAY CO., LTD., Seoul (KR)

(72) Inventor: SeYeoul Kwon, Osan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 180 days.

(21) Appl. No.: 16/118,213

(22) Filed: Aug. 30, 2018

(65) Prior Publication Data
US 2019/0067410 A1 Feb. 28, 2019

(30) Foreign Application Priority Data

Aug. 31, 2017 (KR) .......................... 10-2017-0111094

(51) Int. Cl.
*H01L 27/32* (2006.01)
*H01L 51/00* (2006.01)
*H01L 51/52* (2006.01)

(52) U.S. Cl.
CPC ...... *H01L 27/3276* (2013.01); *H01L 27/3258* (2013.01); *H01L 51/0097* (2013.01); *H01L 51/5253* (2013.01); *H01L 2251/301* (2013.01); *H01L 2251/303* (2013.01); *H01L 2251/5338* (2013.01); *H01L 2251/5392* (2013.01)

(58) Field of Classification Search
CPC ............. H01L 27/3297; H01L 27/3276; H01L 27/3279; H01L 27/3288; H01L 27/329; H01L 51/0097; H01L 2251/5338; H01L 27/3258; H01L 51/5253; H01L 2251/5392; H01L 2251/301; H01L 2251/303; G02F 1/13452; G02F 1/13305; G02F 1/136295; G02F 1/13629; G02F 1/136286; G02F 1/133305; G02F 1/1345
See application file for complete search history.

(56) References Cited

U.S. PATENT DOCUMENTS

| | | | |
|---|---|---|---|
| 2014/0232956 A1* | 8/2014 | Kwon | H01L 27/3276 349/12 |
| 2016/0093685 A1* | 3/2016 | Kwon | H01L 27/323 257/40 |
| 2017/0077447 A1 | 3/2017 | Kang et al. | |
| 2017/0288009 A1* | 10/2017 | Kim | H01L 27/3279 |
| 2017/0288168 A1* | 10/2017 | Kim | H01L 51/5253 |
| 2017/0302772 A1* | 10/2017 | Zhang | H01L 51/56 |
| 2017/0371195 A1* | 12/2017 | Tomioka | H01L 51/5234 |
| 2018/0047802 A1* | 2/2018 | Yoon | H01L 27/3276 |
| 2018/0269427 A1* | 9/2018 | Park | H01L 27/3276 |
| 2018/0301520 A1* | 10/2018 | Jin | H01L 27/124 |
| 2019/0027550 A1* | 1/2019 | Shin | H01L 51/5253 |
| 2019/0035869 A1* | 1/2019 | Kim | H01L 51/5237 |
| 2019/0051858 A1* | 2/2019 | Tomioka | G02F 1/1345 |
| 2019/0287433 A1* | 9/2019 | Huang | H01L 27/1259 |

FOREIGN PATENT DOCUMENTS

| | | |
|---|---|---|
| JP | 2005-62699 A | 3/2005 |
| KR | 10-2014-0103025 A | 8/2014 |
| KR | 10-2017-0032955 A | 3/2017 |
| KR | 10-2017-0063606 A | 6/2017 |

* cited by examiner

*Primary Examiner* — Yu Chen
(74) *Attorney, Agent, or Firm* — Birch, Stewart, Kolasch & Birch, LLP

(57) ABSTRACT

An organic light emitting display apparatus can include a substrate including a display area and a bending area, a routing wiring disposed in the bending area of the substrate, and an oxide thin layer disposed between the substrate and the routing wiring.

12 Claims, 3 Drawing Sheets

ORGANIC LIGHT EMITTING DISPLAY APPARATUS

CROSS-REFERENCE TO RELATED APPLICATIONS

This application claims the priority benefit of the Korean Patent Application No. 10-2017-0111094 filed in the Republic of Korea on Aug. 31, 2017, which is hereby incorporated by reference as if fully set forth herein.

BACKGROUND

Field of the Invention

The present disclosure relates to an organic light emitting display apparatus.

Discussion of the Related Art

With the advancement of an information-oriented society, various requirements for display apparatuses for displaying an image are increasing. Organic light emitting display apparatuses, self-emitting display apparatuses, have a wide viewing angle, an excellent contrast, and a fast response time, and thus, are attracting much attention as next-generation display apparatuses. Recently, organic light emitting display apparatuses which are more slimmed are being released. Flexible organic light emitting display apparatuses are easy to carry and may be applied to various image display apparatuses.

Flexible organic light emitting display apparatuses may include a bending area which enables a substrate to be folded. Also, the substrate may be folded by using this bending area, and thus, a bezel size is reduced, thereby implementing organic light emitting display apparatuses having a narrow bezel. However, if a degree of bending increases for narrowing a bezel, a buffer layer and an insulation layer which are vulnerable to stress are broken, and a crack occurs in a routing wiring to cause short circuit.

If the buffer layer and the insulation layer are removed from the bending area to solve such problems, bending is easily performed, but due to a low adhesive force between the routing wiring and a substrate, the partial detachment of the routing wiring from the substrate occurs.

SUMMARY

Accordingly, the present disclosure is directed to an organic light emitting display apparatus that substantially obviates one or more problems due to limitations and disadvantages of the related art.

An aspect of the present disclosure is directed to an organic light emitting display apparatus in which an adhesive force between a substrate and a routing wiring is strengthened, and cracking of the routing wiring is prevented or minimized.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, there is provided an organic light emitting display apparatus including a substrate including a display area and a bending area, a routing wiring disposed in the bending area of the substrate, and an oxide thin layer provided between the substrate and the routing wiring.

Both the foregoing general description and the following detailed description of the present disclosure are explanatory and are intended to provide examples and further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure. In the drawings.

DETAILED DESCRIPTION OF THE DISCLOSURE

Figure 1:
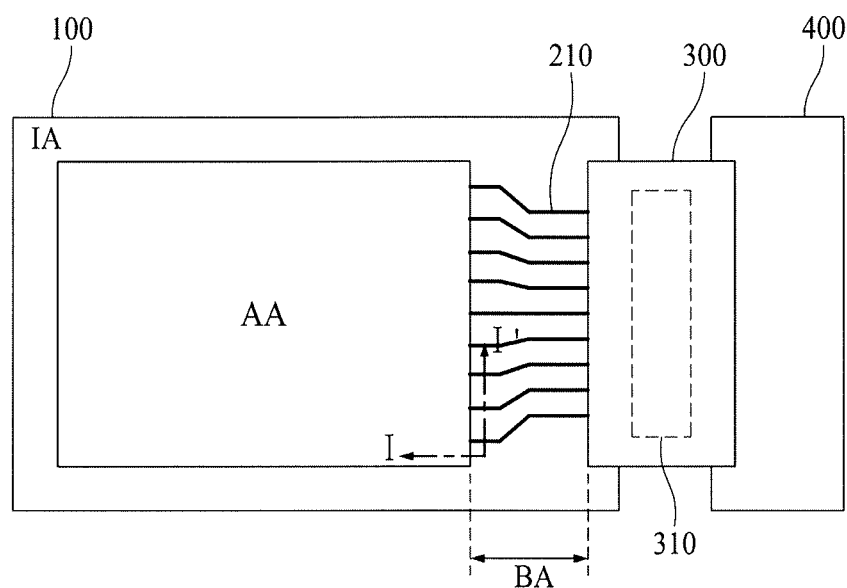
FIG. 1 is a plan view illustrating an organic light emitting display apparatus according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

A shape, a size, a ratio, an angle, and a number disclosed in the drawings illustrating embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure points of the present disclosure, the detailed description will be omitted.

When "comprise," "have." and "include" described in the present specification are used, another part can be added unless "only" is used. The terms of a singular form can include plural forms unless referred to the contrary.

In construing an element, the element is construed as including an error range although there is no explicit description.

In describing a position relationship, for example, when a position relation between two parts is described as "on," "over," "under," and "next," one or more other parts may be disposed between the two parts unless "just" or "direct" is used.

In describing a time relationship, for example, when the temporal order is described as "after," "subsequent," "next," and "before," a situation which is not continuous may be included unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

A first horizontal axis direction, a second horizontal axis direction, and a vertical axis direction should not be construed as only a geometric relationship where a relationship therebetween is vertical, and may denote having a broader directionality within a scope where elements of the present disclosure operate functionally.

The phrase "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be performed independently from each other, or may be performed together in co-dependent relationship.

Hereinafter, example embodiments of an organic light emitting display apparatus according to the present disclosure will be described in detail with reference to the accompanying drawings. In the specification, in adding reference numerals for elements in each drawing, it should be noted that like reference numerals already used to denote like elements in other drawings are used for elements wherever possible.

Figure 2:
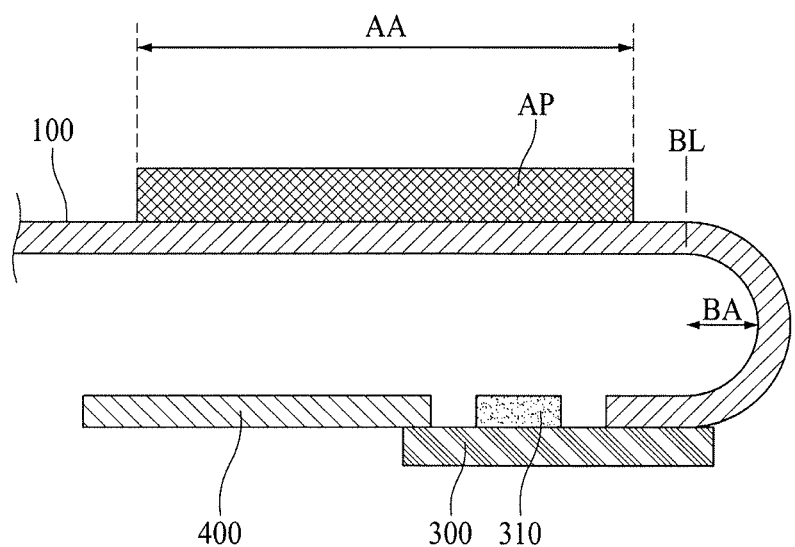
FIG. 2 is a cross-sectional view illustrating an example where the organic light emitting display apparatus of FIG. 1 is bent according to an embodiment of the present disclosure.

FIG. 1 is a plan view illustrating an organic light emitting display apparatus according to an embodiment of the present disclosure, and FIG. 2 is a cross-sectional view illustrating an example where the organic light emitting display apparatus of FIG. 1 is bent.

Referring to FIGS. 1 and 2, the organic light emitting display apparatus according to an embodiment of the present disclosure can include a substrate 100, a display part AP, a driver 300, and a circuit board 400.

The substrate 100, a thin film transistor (TFT) array substrate, can be formed of glass, plastic, and/or the like. The substrate 100 according to an embodiment can include a display area AA and a non-display area IA.

The display area AA can be provided in a portion, other than an edge, of the substrate 100. The display area AA can be defined as an area where the display part AP for displaying an image is disposed.

The non-display area IA can be provided in the other portion except the display area AA provided on the substrate 100 and can be defined as an edge of the substrate 100 surrounding the display area AA. The non-display area IA can be a peripheral area outside the display area AA and may not display an image unlike the display area AA. Also, the non-display area IA can include a bending area BA connected to the driver 300.

The bending area BA can be an area disposed in the non-display area IA and can be an area where a routing wiring 210 connecting the driver 300 to the display part AP is disposed. The bending area BA can be an area which is provided in order for a portion of the non-display area IA to be folded in one direction, and causes a reduction in a bezel of the organic light emitting display apparatus according to embodiments of the present disclosure. An element which enables bending to be easily performed can be disposed in the bending area BA according to an embodiment, and a detailed structure relevant thereto will be described below.

The display part AP can be provided in the display area AA of the substrate 100. The display part AA according to an embodiment can be connected to the driver 300 through the routing wiring 210 and can receive video data supplied from a display driving system to display an image. A detailed structure of the display part AP will be described below.

The driver 300 can be connected to a pad part provided in the non-display area IA of the substrate 100 and can display an image, corresponding to the video data supplied from the display driving system, on the display area AA. The driver 300 according to an embodiment can include a driving circuit 310 and can have a chip-on film (COF) structure. For example, the driver 300 can include a flexible film, a driving integrated circuit (IC) disposed on the flexible film, and a plurality of driving terminals disposed in or on one edge of the flexible film.

The circuit board 400 can be electrically connected to the driver 300. The circuit board 400 according to an embodiment can transfer signals and power between elements of the driver 300. The circuit board 400 can be a printed circuit board (PCB) having flexibility.

Referring again to FIG. 2, the bending area BA of the substrate 100 can be folded in one direction. In more detail, a bending line BL can be disposed at a position which is spaced apart from, by a certain interval, an edge of the display part AP provided on the substrate 100. The bending line BL can be a line at which the substrate 100 is folded about, and the bending line BL can be disposed adjacent to the edge of the display part AP, thereby minimizing a bezel of the organic light emitting display apparatus.

Figure 3:
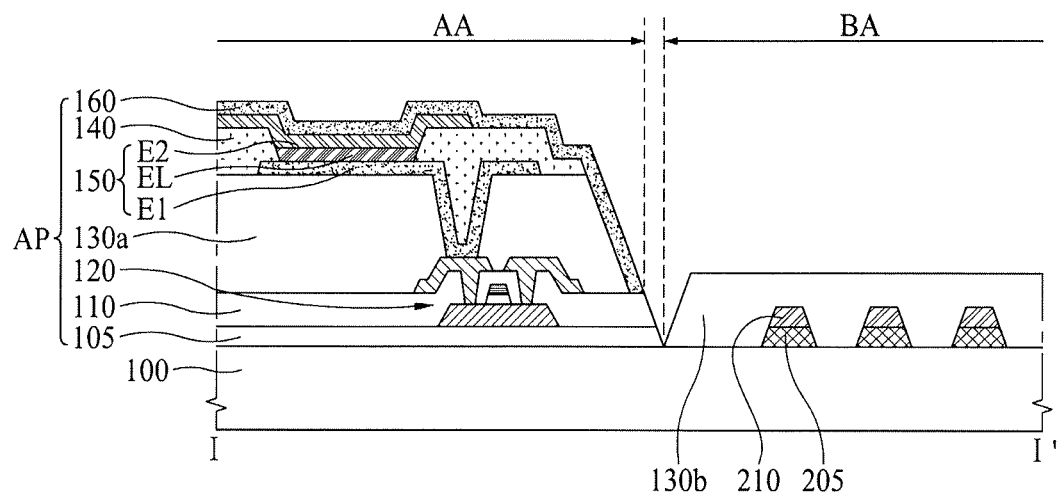
FIG. 3 is a cross-sectional view, taken along line I-I' of FIG. 1, of an organic light emitting display apparatus according to an embodiment of the present disclosure.
Figure 4:
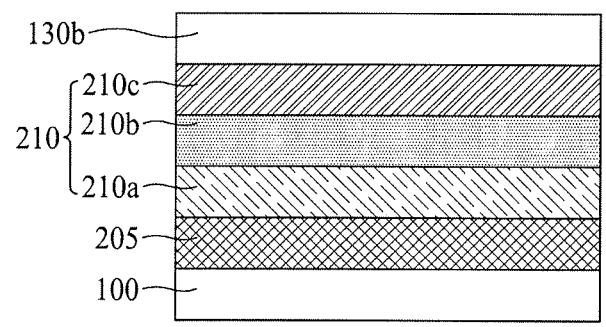
FIG. 4 is a cross-sectional view of an organic light emitting display apparatus according to an embodiment of the present disclosure and is an enlarged view of a structure of an area where a routing wiring is provided in the organic light emitting display apparatus illustrated in FIG. 3.

FIG. 3 is a cross-sectional view, taken along line I-I' of FIG. 1, of an organic light emitting display apparatus according to an embodiment of the present disclosure. FIG. 4 is a cross-sectional view of an organic light emitting display apparatus according to an embodiment of the present disclosure and is an enlarged view of a structure of an area where a routing wiring is provided in the organic light emitting display apparatus illustrated in FIG. 3

Referring to FIGS. 3 and 4, the organic light emitting display apparatus according to the present embodiment can include a substrate 100, a display part AP, a routing wiring 210, an oxide thin layer 205, and a second planarization layer 130b.

The substrate 100, a TFT array substrate, can be formed of glass, plastic, and/or the like. The substrate 100 according to an embodiment can include a display area AA and a non-display area IA. The substrate 100 can have the same thickness in the display area AA and the bending area BA.

The display part AP can be provided in the display area AA of the substrate 100. The display part AP according to an embodiment can include a buffer layer 105, a TFT 120, a first planarization layer 130a, a bank layer 140, a light emitting device layer 150, and an encapsulation layer 160.

The buffer layer 105 can be provided in the display area AA of the substrate 100. The buffer layer 105 according to an embodiment prevents water from penetrating into the display part AP. The buffer layer 105 can be formed of an inorganic insulating material, and for example, can be formed of silicon dioxide ($SiO_2$), silicon nitride (SiNx), or a multilayer thereof, but is not limited thereto.

The TFT 120 can be provided on the buffer layer 105. The TFT 120 according to an embodiment can control the amount of current flowing from the driver 300 to a light emitting device. Thus, the TFT 120 can include a gate electrode, a drain electrode, and a source electrode. The TFT 120 can control a data current flowing from the driver 300 to the light emitting device, thereby allowing the light emitting device to emit having brightness proportional to a data signal supplied through a data line.

The TFT 120 according to an embodiment can include an insulation layer 110 which covers the gate electrode. The insulation layer 110 can be formed of a single layer or a multiplayer including an inorganic material, and for example, can be formed of silicon oxide (SiOx) or SiNx.

The first planarization layer 130a can be provided in the display area AA of the substrate 100 to cover the TFT 120. The first planarization layer 130a protects the TFT 120 and provides a planar surface on the TFT 120. The first planarization layer 130a according to an embodiment can be formed of an organic material, such as benzocyclobutene or photo acryl, but for convenience of a process, the first planarization layer 130a can be formed of a photo acryl material.

The bank layer 140 can be provided on the first planarization layer 130a and can define an opening area. The bank layer 140 according to an embodiment can include an organic material such as benzocyclobutadiene, acryl, or polyimide. Additionally, the bank layer 140 can be formed of a photosensitive agent including a black pigment, and in this instance, the bank layer 140 can act as a light blocking member (or a black matrix).

The light emitting device layer 150 can emit light according to the data signal supplied from the TFT 120. The light emitted from the light emitting device layer 150 can pass through the substrate 100 and be extracted to the outside. The light emitting device layer 150 can include a first electrode E1 connected to the TFT 120, a light emitting layer EL provided on the first electrode E1, and a second electrode E2 provided on the light emitting layer EL.

The first electrode E1 can be an anode electrode and can be provided in a pattern form on the first planarization layer 130a. The first electrode E1 according to an embodiment can be electrically connected to the source electrode of the TFT 120 through a contact hole provided in the first planarization layer 130a and receive the data current output from the TFT 120. The first electrode E1 can be formed of a metal material which is high in reflectivity, and for example, can include a material such as gold (Au), silver (Ag), aluminum (Al), molybdenum (Mo), or magnesium (Mg), or an alloy thereof, but is not limited thereto.

The light emitting layer EL can be provided on the first electrode E1 in the opening area defined by the bank layer 150. The light emitting layer EL according to an embodiment can include a hole injection layer, a hole transport layer, an organic light emitting layer, an electrode transport layer, and an electron injection layer which are sequentially stacked on the first electrode E1. Here, one or two or more of the hole injection layer, the hole transport layer, the electrode transport layer, and the electron injection layer may be omitted. Also, the light emitting layer EL can further include at least one function layer for controlling an electron and/or a hole injected into the organic light emitting layer.

The second electrode E2 can be provided on the substrate 100 to cover the light emitting layer EL and the first bank layer 150 and can be connected to the light emitting layer EL in common. The second electrode E2 can be defined as a cathode electrode or a common electrode, based on a direction of a current flowing in the light emitting layer EL. The second electrode E2 can receive a cathode power supplied from the driver 300. Here, the cathode power can be a ground voltage or a direct current (DC) voltage having a certain level.

The second electrode E2 according to an embodiment can be formed of a transparent metal material which is high in light transmittance. For example, the second electrode E2 can include indium tin oxide (ITO), indium zinc oxide (IZO), indium zinc tin oxide (IZTO), indium cesium oxide (ICO), or indium tungsten oxide (IWO), which is a transparent conductive material such as transparent conductive oxide (TCO). Optionally, in the present embodiment, in order to minimize damage of the light emitting layer EL caused by a process temperature in a process of forming the second electrode E2, the second electrode E2 can be formed of an amorphous transparent conductive material through a low temperature metal deposition process using a process temperature of less than 100 degrees C. That is, when the second electrode E2 is formed of a crystalline transparent conductive material, there may be a problem where the light emitting layer EL is damaged by a high temperature thermal treatment process which is performed on the second electrode E2 to secure a low resistance value, and thus, the second electrode E2 can be formed of the amorphous transparent conductive material through the low temperature metal deposition process.

The encapsulation layer 160 can be provided on the light emitting device layer 150, for preventing penetration of water to protect the light emitting layer EL vulnerable to external water or oxygen. That is, the encapsulation layer 160 can be provided on the substrate 100 to cover the second electrode E2. The encapsulation layer 160 according to an embodiment can be formed of an inorganic layer or an organic layer, or can be formed of a multilayer where an inorganic layer and an organic layer are alternately stacked.

The routing wiring 210 can be provided in the bending area BA of the substrate 100. The routing wiring 210 according to an embodiment can electrically connect the driver 300 to the display part AP and be formed of a metal line.

The routing wiring 210 according to an embodiment can be formed of a rectilinear metal wiring to have a fine pattern, based on an ultra-high definition (UHD) design of the organic light emitting display apparatus. Since the routing wiring 210 has to transfer a data signal to the display part AP in a limited space, a wiring width and a wiring interval can each be set to approximately 2 µm to 4 µm.

The routing wiring 210 according to an embodiment of the present disclosure can be formed of the same material as that of the gate electrode of the TFT 120. The routing wiring 210 can be formed in a process of depositing the gate electrode, and thus, a process is better than a situation where the routing wiring 210 is formed in a process of depositing the source/drain electrode.

The routing wiring 210 according to an embodiment can include a first metal 210a, a second metal 210b, and a third metal 210c.

The first metal 210a can be provided to directly contact the substrate 100 in a lowermost portion of the routing wiring 210. The first metal 210a according to an embodiment can be formed of metal such as titanium (Ti) which is high in strength, and can protect the routing wiring 210 from an external impact.

The second metal 210b can be provided on the first metal 210a. The second metal 210b according to an embodiment can be formed of metal such as aluminum (Al) which is good in conductivity and flexibility. The second metal 210b can be formed to have a thickness which is thicker than that of each of the first metal 210a and the third metal 210c.

The third metal 210c can be provided on the second metal 210b. The third metal 210c according to an embodiment can be formed of the same material (e.g., Ti) as the first metal 210a, for protecting the routing wiring 210 from an external impact and can be formed to have the same thickness as that of the first metal 210a.

The oxide thin layer 205 can be provided in the bending area BA of the substrate 100. In more detail, the oxide thin layer 205 can be provided between the substrate 100 and the routing wiring 210. The oxide thin layer 205 according to an embodiment can be formed of oxide of one of the metals included in the routing wiring 210, and for example, can be formed of oxide of the first metal 210a. For example, the oxide thin layer 205 can be oxide titanium (TiOx). The oxide thin layer 205 can be TiOx which is formed through a reactive sputtering process of simultaneously sputtering Ti and injecting an oxygen gas.

The oxide thin layer 205 according to an embodiment can strengthen an adhesive force between the substrate 100 and the routing wiring 210. In the organic light emitting display apparatus according to an embodiment of the present disclosure, the buffer layer 105 and the insulation layer 110 may not be formed in the bending area BA or can be removed through an etching process, and thus, bending can be easily performed. That is, since the buffer layer 105 and the insulation layer 110 have a structure vulnerable to a stress, the buffer layer 105 and the insulation layer 110 may not be formed in the bending area BA, thereby preventing the occurrence of a crack of a wiring and minimizing a stacked thickness. However, since the adhesive force between the substrate 100 and the routing wiring 210 is weak, if the routing wiring 210 is directly provided on the substrate 100, the partial detachment of the routing wiring 210 from the substrate 100 occurs. Therefore, the oxide thin layer 205 can be provided between the substrate 100 and the routing wiring 210 to strengthen the adhesive force between the substrate 100 and the routing wiring 210, thereby preventing the partial detachment of the routing wiring 210 from the substrate 100.

The oxide thin layer 205 can be oxide of the first metal 210a and can be easily bonded to the first metal 210a. That is, the oxide thin layer 205 can be formed through a reactive sputtering process of injecting an oxygen gas into a material (for example, Ti) of the first metal 210a, and thus, can be easily bonded to the first metal 210a. Also, the oxide thin layer 205 can be oxide of metal instead of metal, and thus, can be easily bonded to the substrate 100 including glass or plastic. Accordingly, the oxide thin layer 205 can be provided between the substrate 100 and the first metal 210a to strengthen an adhesive force therebetween.

The second planarization layer 130b can be provided to cover the routing wiring 210. The second planarization layer 130b can protect the routing wiring 210 and provide a planar surface on the routing wiring 210. The second planarization layer 130b according to an embodiment can be formed of an organic material which is the same as that of the first planarization layer 130a, and can be patterned and formed in a deposition process of forming the first planarization layer 130a.

The second planarization layer 130b can provide a planar surface in the bending area BA, for preventing a crack from occurring in bending due to a step height which occurs in the bending area BA due to the routing wiring 210 spaced apart from the second planarization layer 130b. Also, the second planarization layer 130b can be formed of a material for preventing penetration of water and can protect the routing wiring 210 from external water or foreign materials.

Figure 5:
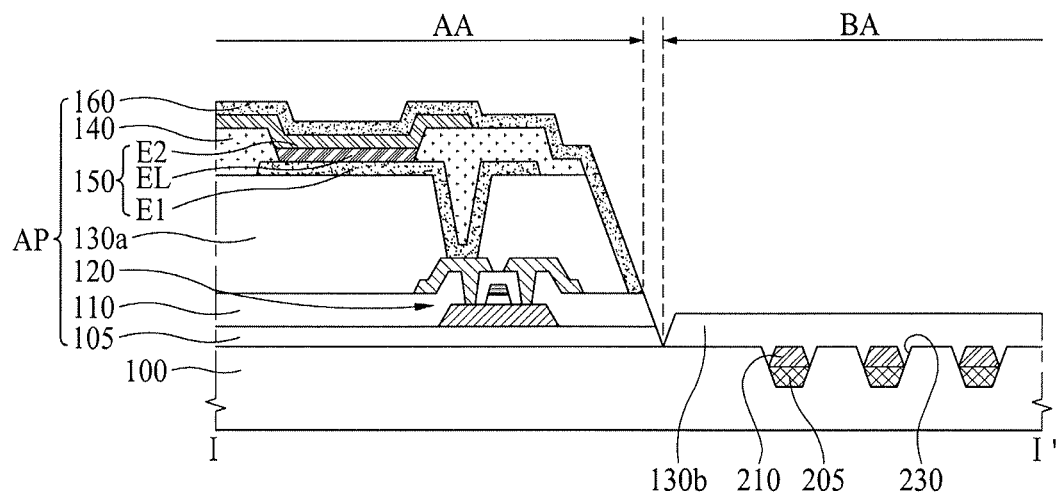
FIG. 5 is a cross-sectional view of an organic light emitting display apparatus according to an embodiment of the present disclosure and illustrates an example where a structure of a substrate in the organic light emitting display apparatus illustrated in FIG. 3 is modified.

FIG. 5 is a cross-sectional view of an organic light emitting display apparatus according to an embodiment of the present disclosure and illustrates an example where a structure of a substrate in the organic light emitting display apparatus illustrated in FIG. 3 is modified.

Referring to FIG. 5, the organic light emitting display apparatus according to an embodiment of the present disclosure can include a concave portion 230 which is disposed in a bending area BA of a substrate 100 and is concavely recessed from the substrate 100. Hereinafter, overlapping descriptions of elements which are the same as or similar to the elements of FIG. 3 are omitted or provided briefly, and only a feature of the concave portion 230 will be described.

The concave portion 230 can be concavely provided in the bending area BA to have a certain depth from a top of the substrate 100 provided in a display area AA. In this instance, the concave portion 230 can be provided to have a predetermined depth, in order for a neutral surface to be disposed on the routing wiring 210. For example, the concave portion 230 can have a depth of approximately 2 µm from the surface of the substrate 100 provided in a display area AA. The concave portion 230 can have a groove or cup form, but is not limited thereto.

The concave portion 230 according to an embodiment can include a floor surface, and the floor surface of the concave portion 230 can have a certain depth from the top of the substrate 100 provided in a display area AA. The oxide thin layer 205 can be provided on the floor surface of the concave portion 230, and the oxide thin layer 205 can be provided to directly contact the floor surface of the concave portion 230.

The concave portion 230 according to an embodiment can enable a neutral surface (e.g., a conceptual plane or interface between a zone that is in compression and a zone that is in tension, there is minimal or no lengthwise stress force on the neutral plane) to be disposed on the routing wiring 210. For example, the routing wiring 210 can be disposed on or near the area where a neutral surface exists in order to minimize stress on the wiring. Since the routing wiring 210 is vulnerable to bending, a crack can occur, and the routing wiring 210 can be short-circuited. However, when the neutral surface is disposed on the routing wiring 210, a bending stress applied to the routing wiring 210 is minimized, and thus, a stress is minimized. Also, a crack does not occur in maximum bending, and thus, the organic light emitting display apparatus can have a narrower bezel.

Due to the concave portion 230, the neutral surface can be disposed in a second metal 210b (e.g., the neutral surface can pass through or near the second metal 210b while in the bent position). The second metal 210b can be formed of a material which is high in conductivity, and can transfer a data signal to a display part AP. The second metal 210b can be formed of a material which is higher in conductivity than a first metal 210a and a third metal 210c, and can be a main metal for transferring the data signal. Therefore, when a crack occurs in the second metal 210b, the routing wiring 210 can be wholly short-circuited. Therefore, the neutral surface can be disposed in the second metal 210b, for maximum bending. In other words, the second metal 210b is arranged so that the second metal 210b will be located in the neutral surface when the substrate is bent (e.g., the safest place or area that experiences the least amount of bending stress).

As the substrate 100 is bent, one side can be stretched, and the other side can be contracted, with respect to a specific surface. In this instance, the neutral surface can denote a surface which is provided in a center portion and has no contractility. Here, the neutral surface can denote a neutral surface of a portion which is provided in the bending area BA of the substrate 100 in the organic light emitting display apparatus according to the present embodiment.

Referring again to FIG. 5, an oxide thin layer 205 and the routing wiring 210 can be provided on the floor surface of the concave portion 230, and a top of the routing wiring 210 can be disposed in parallel with a top of the substrate 100 disposed in an area where the concave portion 230 is not provided. That is, the routing wiring 210 can be spaced apart from an adjacent routing wiring by the substrate 100 (e.g., portions of the substrate can exists between adjacent wires, and those portions of the substrate can be used to separate and electrically isolate the wires from each other).

The routing wiring 210 according to embodiments the present disclosure can be formed of a rectilinear metal wiring to have a fine pattern and can have a wiring width of approximately 2 μm to 4 μm and a wiring interval of approximately 2 μm to 4 μm. In the routing wiring 210, an interval between adjacent wirings can be narrow, and for this reason, noise can occur due to an electrical influence between adjacent wirings. When the routing wiring 210 is provided in the concave portion 230 of the substrate 100, a convex portion provided on a side surface of the concave portion 230 can surround a side surface of the routing wiring 210, and thus, the routing wiring 210 disposed in the concave portion 230 of the substrate 100 can be spaced apart from an adjacent routing wiring by the substrate 100. The substrate 100 can be formed of a material which is high in electrical insulation and heat resistance, and this effect is higher than a planarization layer. Therefore, since a planarization layer surrounds the side surface of the routing wiring 210 and because part of the substrate can also be between the wires, noise caused by an electrical influence between adjacent routing wirings 210 is minimized in comparison with a structure where adjacent routing wirings 210 are spaced apart from each other, thereby increasing the reliability of the organic light emitting display apparatus. For example, both the substrate 100 and the second planarization layer 130b can work together to help block noise interference between adjacent wires among the routing wiring 210.

Figure 6:
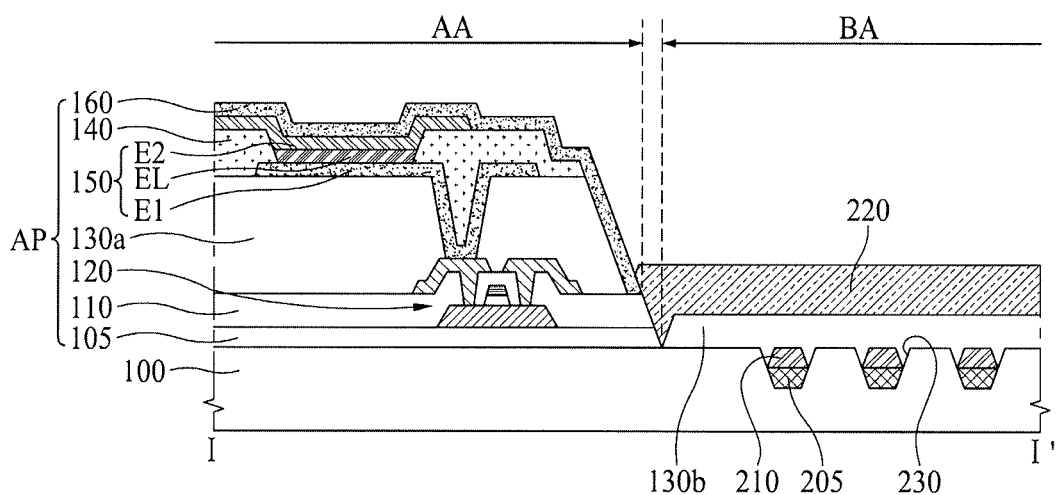
FIG. 6 is a cross-sectional view of an organic light emitting display apparatus according to an embodiment of the present disclosure and illustrates a structure where a micro coating layer is added to the organic light emitting display apparatus illustrated in FIG. 5.

FIG. 6 is a cross-sectional view of an organic light emitting display apparatus according to an embodiment of the present disclosure and illustrates a structure where a micro coating layer is added to the organic light emitting display apparatus illustrated in FIG. 5.

Referring to FIG. 6, the organic light emitting display apparatus according to an embodiment of the present disclosure can include a micro coating layer 220 which is disposed in a bending area BA of a substrate 100 and covers a second planarization layer 130b. Hereinafter, overlapping descriptions of elements which are the same as or similar to the elements of FIG. 5 are omitted or provided briefly, and only a feature of the micro coating layer 220 will be described.

The micro coating layer 220 can be provided on a whole surface of the bending area BA of the substrate 100 to cover the second planarization layer 130b. The micro coating layer 220 according to an embodiment can be formed of a photocurable resin and be coated on target areas of the organic light emitting display apparatus according to an embodiment of the present disclosure. In this regard, the micro coating layer 220 can be coated on a whole surface of the bending area BA and contact an edge of the active area AA.

The micro coating layer 220 according to an embodiment can be coated to have a predetermined thickness, to adjust a neutral surface of a portion which is provided in the bending area BA of the substrate 100 in the organic light emitting display apparatus according to the present embodiment. In more detail, the neutral surface in the bending area BA of the organic light emitting display apparatus can be adjusted by the micro coating layer 220 to be located on or centered on the routing wiring 210.

For example, as the micro coating layer 220 is thickly coated, the neutral surface can be raised to an upper portion of the substrate 100 and can be located on the routing wiring 210, and in this instance, the neutral surface can be located in a region, which is vulnerable to a stress, of the routing wiring 210. The micro coating layer 220 can adjust the neutral surface along with a concave portion 230, thereby minimizing a stress which occurs in the bending area BA in bending.

As described above, the organic light emitting display apparatus according to embodiments of the present disclosure is optimized for a stress, and thus, maximum bending can be performed safely without damaging any wiring.

Moreover, in the organic light emitting display apparatus according to embodiments of the present disclosure, bending can be easily performed, and the partial detachment of the routing wiring from the substrate is prevented.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

What is claimed is:

1. An organic light emitting display apparatus comprising:
a substrate including a display area and a bending area;
a thin film transistor (TFT) disposed in the display area of the substrate;
a plurality of routing wirings disposed in the bending area of the substrate; an oxide thin layer disposed between the substrate and the plurality of routing wirings;
a first planarization layer covering the TFT; and
a second planarization layer covering the plurality of routing wirings, wherein the oxide thin layer has a pattern corresponding to the plurality of routing wirings,
wherein an upper surface of the oxide thin layer directly contacts a lower surface of the plurality of routing wirings in the bending area, and a lower surface of the oxide thin layer directly contacts an upper surface of the substrate in the bending area,
wherein at least a part of the second planarization layer directly contacts an upper surface of the substrate in the bending area,
wherein the first planarization layer and the second planarization layer are spaced apart from each other,
wherein the second planarization layer has a thickness less than a thickness of the first planarization layer,
wherein the plurality of routing wirings comprise:
a first metal on the oxide thin layer;
a second metal on the first metal; and
a third metal on the second metal,
wherein the oxide thin layer comprises an oxide of the first metal, and
wherein the oxide thin layer comprises an oxide of a metal which is a same metal that is included in the plurality of routing wirings,
the oxide thin layer having a tapered shape relative to the substrate, each of the plurality of routing wirings having a tapered shape relative to the substrate, and each of the plurality of routing wirings having an inclined side surface that is flush with an inclined side surface of the oxide thin layer.

2. The organic light emitting display apparatus of claim 1, wherein the oxide thin layer comprises titanium oxide (TiOx).

3. The organic light emitting display apparatus of claim 1,
wherein the first metal comprises titanium (Ti), the third metal comprises titanium (Ti), and the second metal comprises aluminum (Al).

4. The organic light emitting display apparatus of claim 1, further comprising:
a display part in the display area of the substrate,
wherein the display part comprises:
the thin film transistor (TFT) for controlling a data current flowing to a light emitting device;
the first planarization layer covering the TFT;
a light emitting device layer provided on the first planarization layer and connected to the TFT; and
an encapsulation layer covering the light emitting device layer.

5. The organic light emitting display apparatus of claim 4, wherein the first and second planarization layers both comprise a same material.

6. The organic light emitting display apparatus of claim 5, further comprising a micro coating layer disposed on the second planarization layer.

7. The organic light emitting display apparatus of claim 6, wherein a thickness of the micro coating layer is configured to adjust a neutral plane of the bending area to be centered on the plurality of routing wirings.

8. The organic light emitting display apparatus of claim 4, wherein the plurality of routing wirings comprises a material which is the same as a material of a gate electrode of the TFT.

9. The organic light emitting display apparatus of claim 1,
wherein the second metal is thicker than the first metal, and the second metal is thicker than the third metal.

10. The organic light emitting display apparatus of claim 1, wherein a portion of the oxide thin layer under each of the plurality of routing wirings has a trapezoidal cross section, and
wherein each of the plurality of routing wirings has a trapezoidal cross section.

11. The organic light emitting display apparatus of claim 10, wherein a width of an upper surface of the portion of the oxide thin layer is equal to a width of a lower surface of a corresponding routing wiring among the plurality of routing wirings.

12. The organic light emitting display apparatus of claim 1, wherein the second planarization layer includes a plurality of protrusions extending between the plurality of routing wirings and contacting an inclined side surface of at least one of the plurality of routing wirings, and
wherein each of the plurality of protrusions has a reverse tapered shape relative to the substrate.

* * * * *